United States Patent
Dreps et al.

(10) Patent No.: US 7,212,035 B2
(45) Date of Patent: May 1, 2007

(54) LOGIC LINE DRIVER SYSTEM FOR PROVIDING AN OPTIMAL DRIVER CHARACTERISTIC

(75) Inventors: Daniel M. Dreps, Georgetown, TX (US); John C. Schiff, Austin, TX (US); Glen A. Wiedemeier, Austin, TX (US); Joel D. Ziegelbein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 11/055,834

(22) Filed: Feb. 11, 2005

(65) Prior Publication Data

US 2006/0181304 A1   Aug. 17, 2006

(51) Int. Cl.
*H03K 19/0175* (2006.01)

(52) U.S. Cl. .......................................... 326/83; 326/87
(58) Field of Classification Search ............. 326/82–89
See application file for complete search history.

(56) References Cited

U.S. PATENT DOCUMENTS

| | | | |
|---|---|---|---|
| 5,739,707 A * | 4/1998 | Barraclough | 327/112 |
| 6,127,862 A * | 10/2000 | Kawasumi | 327/112 |
| 6,624,662 B1 * | 9/2003 | Volk | 326/87 |
| 6,642,742 B1 * | 11/2003 | Loyer | 326/30 |
| 6,704,818 B1 * | 3/2004 | Martin et al. | 710/100 |
| 6,794,909 B1 * | 9/2004 | Urakami et al. | 327/112 |
| 6,909,305 B1 * | 6/2005 | Li et al. | 326/30 |
| 6,980,018 B2 * | 12/2005 | Ngo et al. | 326/26 |

* cited by examiner

Primary Examiner—Don Le
(74) Attorney, Agent, or Firm—Winstead PC

(57) ABSTRACT

A line driver for off-chip communication comprises multiple parallel stages each with separate inputs. The parallel stages each have a controlled impedance when driving the line driver output node to a logic zero or a logic one. A line driver controller is used to select what combination of driver stages are used to drive the output node based on whether the output node is transitioning between logic state or is remaining static. During power-up, a test program tries different combinations of driver stages for particular symbol patterns and determines what is the optimal ratio between line driver resistance for the dynamic and static cases and stores the optimum combination. The data stream feeding the line driver is sampled in real time to determine the transition states and selects the optimal number of driver stages for each case.

14 Claims, 5 Drawing Sheets

LOGIC LINE DRIVER SYSTEM FOR PROVIDING AN OPTIMAL DRIVER CHARACTERISTIC

TECHNICAL FIELD

The present invention relates in general to board level transmission line drivers and receivers, and in particular, to receiver circuits for shaping receiver transmission line signals.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (crosstalk) affects signal quality. One way to alleviate the detrimental effects of noise and coupling is through the use of differential signaling. Differential signaling comprises sending a signal and its complement to a differential receiver. In this manner, noise and coupling affect both the signal and the complement equally. The differential receiver only senses the difference between the signal and its complement as the noise and coupling represent common mode signals. Therefore, differential signaling is resistant to the effects that noise and crosstalk have on signal quality. On the negative side, differential signaling increases pin count by a factor of two for each data line. The next best thing to differential signaling is pseudo-differential signaling. Pseudo-differential signaling comprises comparing a data signal to a reference voltage using a differential receiver or comparator.

When high speed data is transmitted between chips, the signal lines are characterized by their transmission line parameters. High speed signals are subject to reflections if the transmission lines are not terminated in an impedance that matches the transmission line characteristic impedance. Reflections may propagate back and forth between driver and receiver and reduce the margins when detecting signals at the receiver. Some form of termination is therefore usually required for all highspeed signals to control overshoot, undershoot, and increase signal quality. Typically, a Thevenin's resistance (equivalent resistance of the Thevenin's network equals characteristic impedance of transmission line) is used to terminate data lines allowing the use of higher valued resistors. Additionally, the Thevenin's network is used to establish a bias voltage between the power supply rails. In this configuration, the data signals will then swing around this Thevenin's equivalent bias voltage. When this method is used to terminate data signal lines, a reference voltage is necessary to bias a differential receiver that operates as a pseudo-differential receiver to detect data signals in the presence of noise and crosstalk.

The logic levels of driver side signals are determined by the positive and ground voltage potentials of the driver power supply. If the driver power supply has voltage variations that are unregulated, then the logic one and logic zero levels of the driver side signals will undergo similar variations. If the receiver is substantially remote from the driver such that its power supply voltage may undergo different variations from the driver side power supply, then additional variations will be added to any signal received in a receiver side terminator (e.g., Thevenin's network). These power supply variations will reduce noise margins if the reference has variations different from those on the received signals caused by the driver and receiver side power supply variations.

When using pseudo-differential signaling for communicating between integrated circuit (IC) chips, the accuracy of the reference compare level (Vref) tends to be one of the large limiting factors in extending this reduced power and area signaling method to the multi-gigahertz frequency range. The variations in Vref due to process variations, package variations, and variations resulting from noise events, all contribute to tolerances that must be overcome by using a larger voltage swing. Reducing these tolerances may result in a pseudo-differential signaling bus design that may be used for signals in the 2–3 Gigahertz frequency range without resorting to larger signal swings and thus higher power and increased area.

The performance of a typical chip-to-chip communication interface is constrained by the finite bandwidth of the communication channel (the channel can be viewed as a low pass filter). As the signaling frequency increases, the increased attenuation of the highest frequency signal components causes the signal edges to be rolled off. This "spreading" of the signal edges also leads to increased inter-symbol (e.g., logic states on successive clock cycles) interference (ISI) where the energy from previous logic state(s) interferes with the presently asserted logic state. Edge roll off and ISI decrease timing and noise margins and prevent error free communication at higher frequencies.

Solving this bandwidth problem has involved the use of a pre-compensating driver that dynamically changes strength depending on the transmitted bit history. In essence, a stronger driver is used when the symbol pattern entails switching the signal's logic state (e.g., "0" to "1" or "1" to "0" transition), and a weaker driver is used when the symbol pattern requires no logic state changes between consecutive symbols. This solution inherently involves choosing a ratio of strong driver strength to weak driver strength (where strength is usually measured as the driver's output resistance). The circuit designer would typically choose an optimal ratio depending on the attenuation of the communication channel.

The optimal pre-compensation ratio depends on the communication channel, therefore, a circuit optimally tuned for one channel will likely perform sub-optimally on another channel having different attenuation characteristics. This is the problem with the previous solution: As the channel changes, the circuit designer must re-tune the driver circuit in order to achieve optimal performance. This is expensive as it requires (a) the engineer's time and (b) the cost to change the hardware.

There is, therefore, a need for a driver that allows the optimal performance of the driver to be programmable so that the optimal pre-compensation ratio for each driver for each channel path may be set under system control after chip design.

SUMMARY OF THE INVENTION

A programmable line driver is configured as the parallel combination of M driver stages. Each driver stage comprises a series connected P-channel field effect transistor (PFET), resistor R1, resistor R2, and N-channel field effect transistor (NFET). The resistors R1 and R2 have a common node coupled to the output node and are used to set the desired resistance of each stage. The PFET couples the other node of R1 to the positive power supply potential. Each PFET has a separate driver input such that different combinations of PFETs may be used when driving the output node from a logic zero to a logic one. Likewise, the NFET couples the other node of R2 to the negative or ground power supply potential. Each NFET also has a separate input such that different combinations of NFETs may be used when driving the output node from a logic one to a logic zero. Control logic for the driver receives the data stream and determines if the present logic state asserted on the output node is the same or different from the next logic state. Depending on whether the logic state of the output node is to change, whether the change is a transition from a logic one to a logic zero or from a logic zero to a logic one, or whether the logic state will not change, different numbers of driver stages are selected based on a pre-determined pre-compensation ratio. During power-up, the system runs a test program that applies symbol patterns to its various critical I/O lines that employ the programmable line driver. A determination of the optimal pre-compensation ratio is made for each line driver and stored into its particular control logic. For example, registers may be used to determine when logic state transitions are detected relative to an ideal for various combinations of driver stages. During a period of use, data for each particular line driver is sampled and determinations of inter-symbol transitions are made in real time, and the appropriate driver stages for the particular line driver are selected by its control logic based on its stored optimal pre-compensation ratio.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
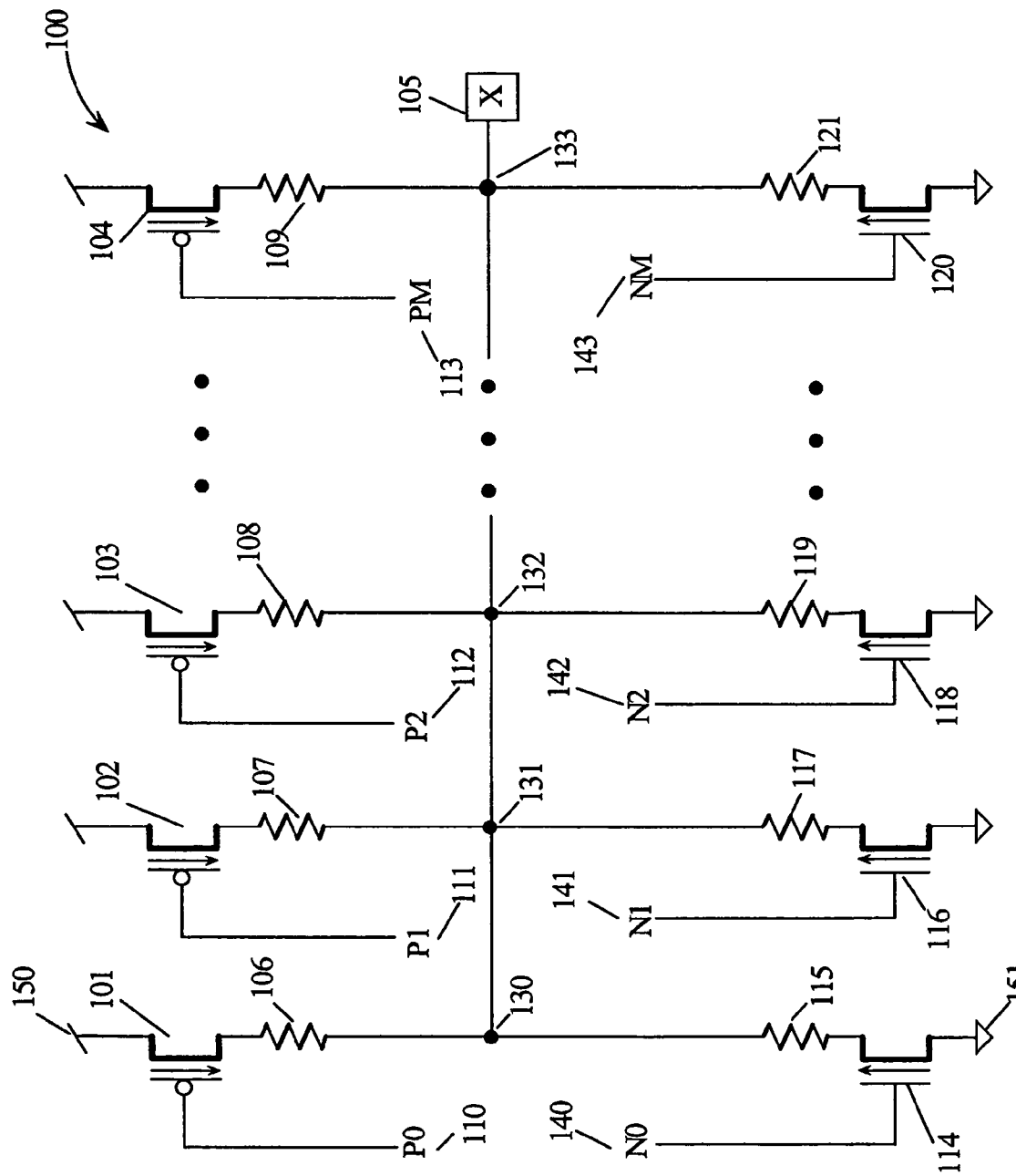
FIG. 1 is a circuit diagram of a programmable line driver according to embodiments of the present invention.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. For the following, a driver pre-compensation ratio is defined as the ratio between a driver impedance during a static logic state and a driver impedance desired during logic state transitions. For example, a pre-compensation ratio of 2:1 would indicate that a driver's impedance during a static logic state is twice its impedance during a logic state transition.

FIG. 1 is a circuit diagram of a line driver according to embodiments of the present invention. Line driver 100 comprises N driver stages. Driver stage (0) is made from series connected PFET 101 and resistor (R) 106 and series connected NFET 114 and R115. R106 and R115 share a common driver output node 130. Driver stage (1) is made from series connected PFET 102 and resistor R 107 and series connected NFET 116 and R117. R107 and R117 share a common driver output node 131. Driver stage (2) is made from series connected PFET 103 and R108 and series connected NFET 118 and R119. R108 and R119 share a common driver output node 132. Finally, driver stage (M) is made from series connected PFET 104 and resistor R 109 and series connected NFET 120 and R 121. R 109 and R 121 share a common driver output node 105. Driver stages (0)–(M) have corresponding inputs P0 110-PM 113 and N0 140-NM 143. Drive stage output nodes 130–133 are coupled to driver output node 105 which is used to couple to a transmission line (e.g., 302 in FIG. 3) used to communicate between integrated circuit (IC) chips (not shown). If exemplary driver stage (0) is active for a given logic state, then either P0 110 is a logic zero or N0 140 is a logic one. If driver stage (0) is not active for a given logic state, then P0 110 is a logic one and N0 140 is a logic zero.

As an example of the operation of the line driver, assume that it is desirable to have only one driver stage ON (e.g., driver stage (0)) if the logic state on output node 105 is static and two driver stages ON (e.g., driver stage (0) and driver stage (1)) during a logic state transition. Assume output node 105 has been at a logic zero for two or more clock cycles, in which case the output logic state is a static logic zero and only driver stage (0) is ON; P0 110 is a logic one and N0 140 is a logic one. Likewise, P1 111 is a logic one and N1 141 is a logic zero (driver stage (1) is OFF). If it is determined that the next logic state is a logic one, then a transition will occur and both driver stage (0) and driver stage (1) will turn ON to set the resistance for the logic state transition. In this case, P0 110 transitions to a logic zero, P1 111 transitions to a logic zero (two drivers ON during a transition), N0 140 transitions to a logic zero and N1 141 stays at a logic zero. If the next logic state stays at a logic one, then one of the PFET stages (e.g., PFET 102) is turned OFF when P1 111 transitions to a logic one. If the output node is to again transition (in this case to a logic zero), then P1 111 remains at a logic one and P0 110, N0 140 and N1 141 all transition to a logic one. Following the preceding method, one can determine the logic states of the inputs of the driver stages for particular symbol patterns and particular desired driver pre-compensation ratios.

In an exemplary case, a 1 bit of history is used to control pre-compensation where arbitrarily M=3, N=5, and the nominal resistance of a single driver stage is 40 ohms, as determined by the resistance values of R 106-R 109, R 115-R 121 and the ON resistance of PFETs 101–104 and NFETs 114–120. In this example, line driver 100 would have six available modes of operation:

1) 40 ohm mode: Only output devices in a single driver stage (e.g., driver stage(0)) is used to set the logic state at output node 105. Compensation ratio 1:1

2) 40/20 ohm mode: If the current logic state equals the previous logic state, only output devices in driver stage (0) drives output node 105 (40 ohms); if the current logic state differs from the previous logic state, devices in both driver stages (0) and (1) drive output node 105 (40/2=20 ohms). Compensation ratio 2:1

3) 40/13 ohm mode: This mode is identical to 40/20 ohm mode except driver stages (0), (1), and (2) drive output node 105 if the current logic state differs from the previous logic state (40/3=~13 ohms). Compensation ratio 3:1

4) 40/10 ohm mode: identical to mode 2) except driver stages (0), (1), (2) and (3) drive output node 105 if the current logic state differs from the previous logic state (40/4=10 ohms). Compensation ratio 4:1

5) 40/8 ohm mode: identical to mode 2) except driver stages (0), (1), (2) (3) and (4) drive output node 105 if the current logic state differs from the previous logic state (40/5=8 ohms). Compensation ratio 5:1

6) 40/6 ohm mode: identical to mode 2) except driver stages (0), (1), (2), (3), (4), and (5) drive output node 105 if the current logic state differs from the previous logic state (40/6=~6 ohms). Compensation ratio 6:1

Figure 2:
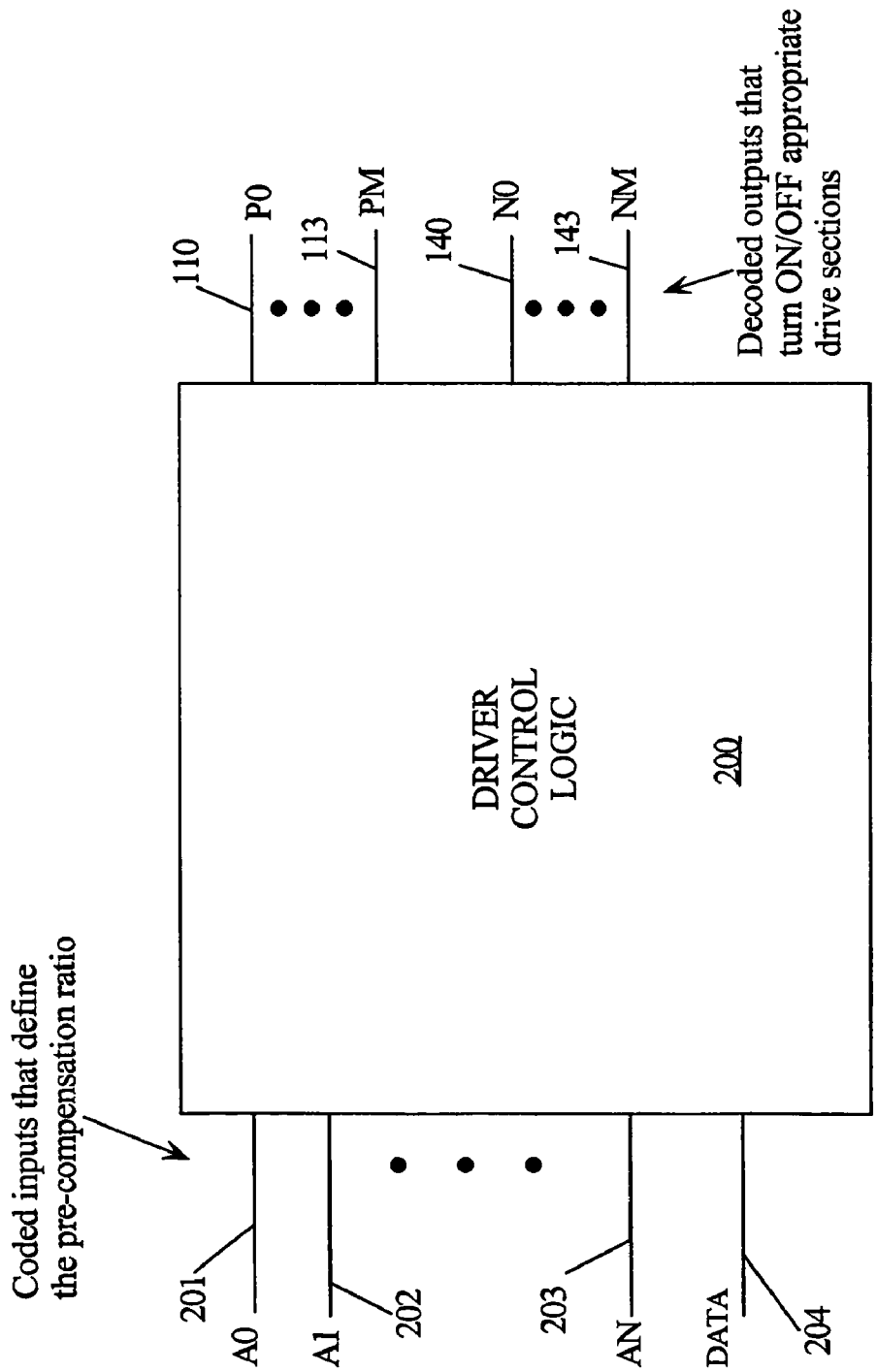
FIG. 2 is a block diagram of a logic controller for a programmable line driver according to embodiments of the present invention.

FIG. 2 is a block diagram of a driver control logic 200 for a line driver configured according to embodiments of the present invention. Driver control logic 200 receives Data 204 and compensation control signals A0 201-AN 203 defining a pre-compensation ratio and generates outputs P0 110-PM 113 and N0-140-NM-143 for controlling the stages of line driver 100.

Figure 3:
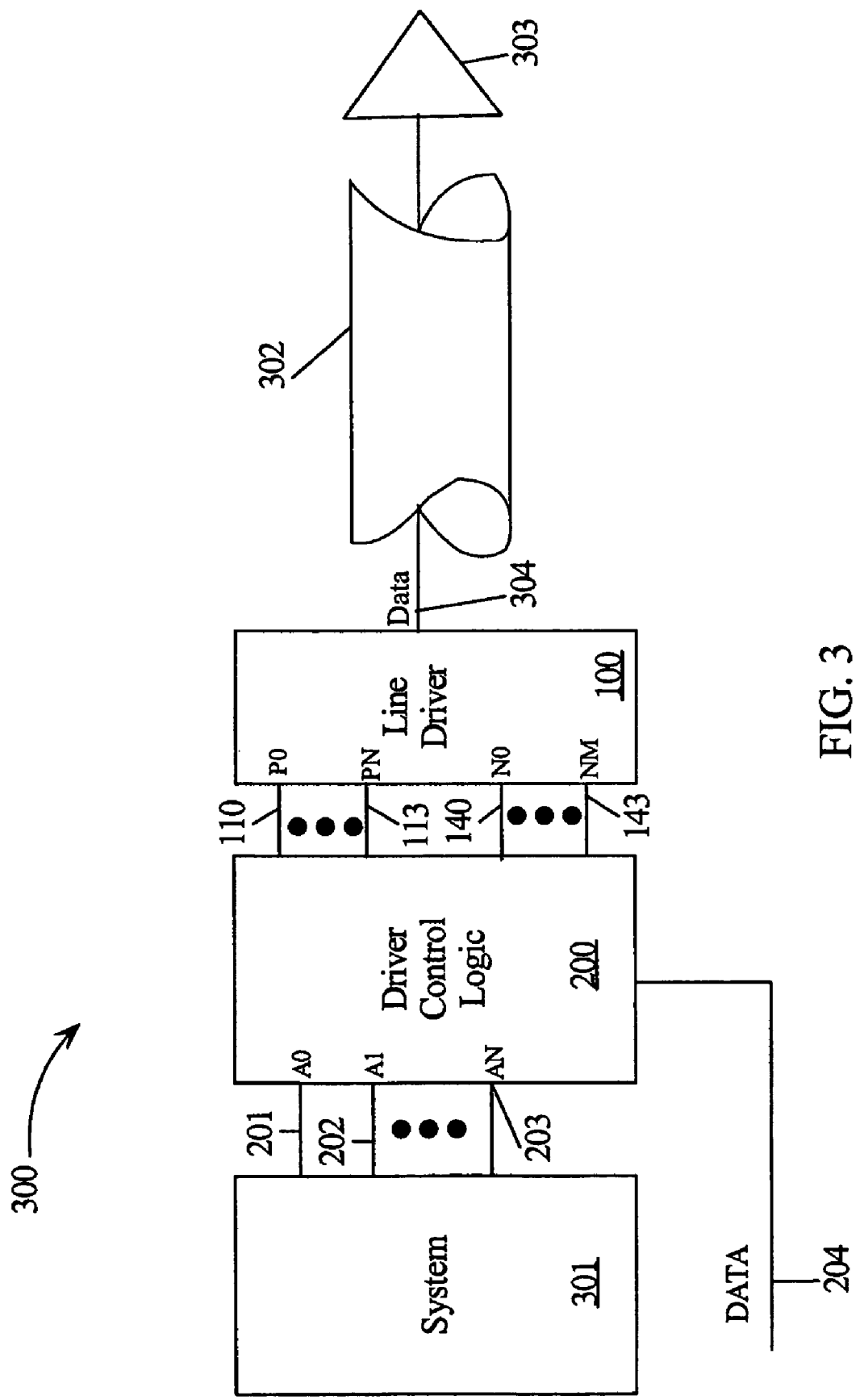
FIG. 3 is a block diagram of a programmable line driver system according to embodiments of the present invention.

FIG. 3 is a block diagram of a programmable line driver system according to embodiments of the present invention. A system 301 determines what pre-compensation ratio is desired for the line drivers in its off-chip data paths. Control signals A0 201-AN-203 determine which of the optional compensation ratios is selected for the drivers. Each line driver (e.g., line driver 100) has driver control logic 200 that stores and decodes the control signals A0 201-AN-203 while generating the desired combinations of driver controls P0 11O-PM 113 and N0 140-NM 143 to select the appropriate number of stages for the particular logic state sequence being sent as Data 304 over transmission line 302 to receiver 303.

Figure 4:
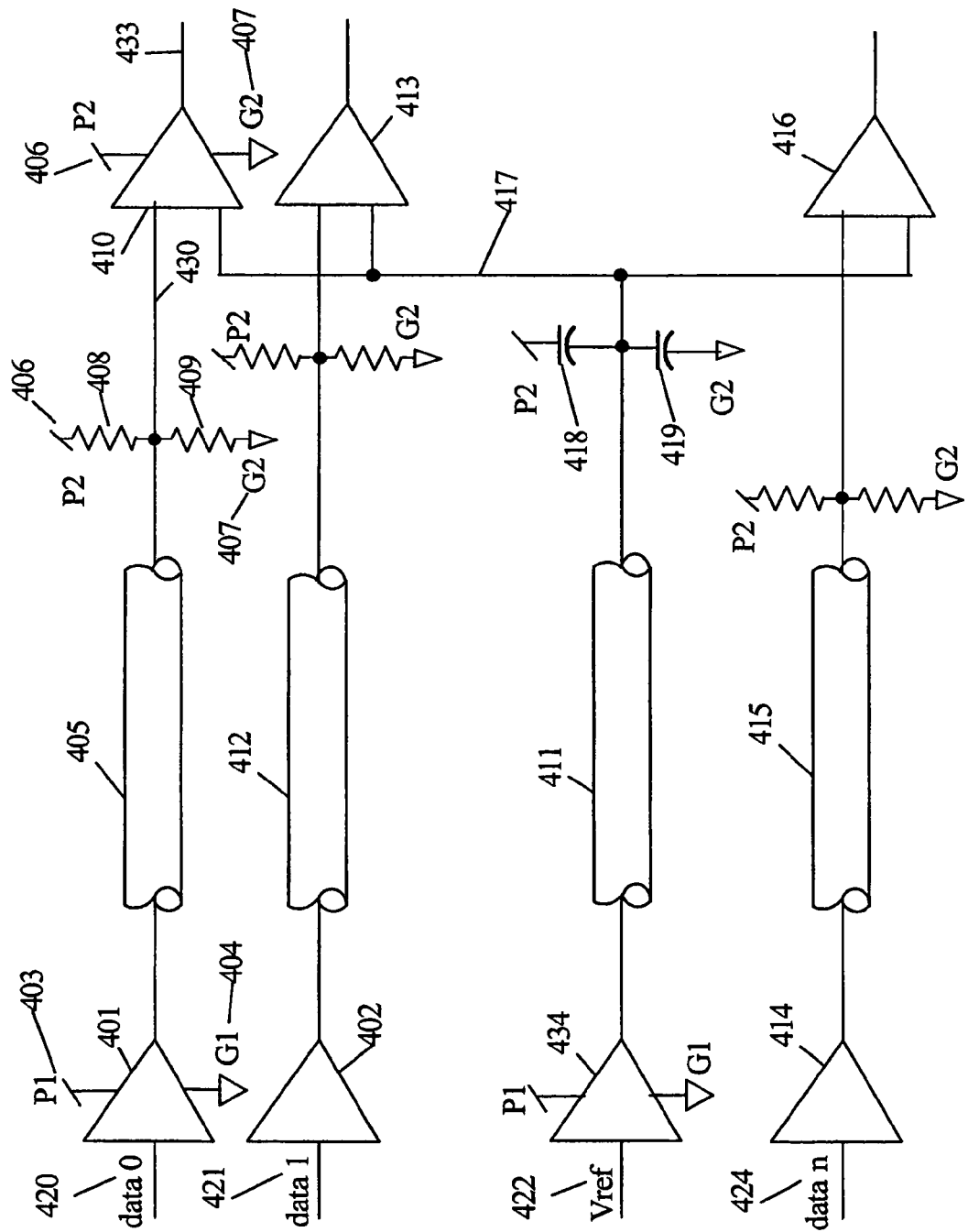
FIG. 4 is a circuit diagram of pseudo-differential signaling with driver side reference voltage generation that is suitable for practicing embodiments of the present invention.

FIG. 4 is a circuit diagram of typical pseudo-differential signaling suitable for practicing embodiments of the present invention and for transmitting data from a programmable line driver (e.g., line driver 100) to a receiver. The multiple programming inputs are not shown in this view for simplicity. Exemplary drivers 401, 402 and 414 may be programmable line drives similar to line driver 100 in FIG. 1 and represent three of a number of n programmable line drives that may be used to send data to receivers 410, 413 and 416, respectively. Each driver 401, 402 and 414 may be optimized, according to embodiments of the present invention, for their particular transmission path (e.g., transmission lines 405, 412 and 415, respectively).

Relative to operation in pseudo-differential signaling, exemplary driver 401 receives data 0 420 and generates an output that swings between power supply rail voltages P1 403 (logic one) and G1 404 (logic zero). When the output of driver 401 is at P1 403, any noise on the power bus is coupled to transmission line 405 along with the logic state of the data signal. Exemplary transmission line 405 is terminated with a voltage divider comprising resistors 408 and 409. Receiver input 430 has a DC bias value determined by the voltage division ratio of resistors 408 and 409 and the voltage between P2 406 and G2 407. Receiver 410 is powered by voltages P2 406 and G2 407 which may have different values from P1 403 and G1 404 due to distribution losses, noise coupling, and dynamic impedance of the distribution network. Exemplary receiver 410 is typically a voltage comparator or high gain amplifier that amplifies the difference between a signal at input 430 and a reference voltage at input 417. Voltage reference Vref 422 may be buffered with amplifier 434 and distributed via line 411 to the exemplary receivers 410, 413 and 416. While Vref 422 may be a stable reference, it normally may not track variations in power supply P1 403. Likewise, the noise on line 411 coupled to node 417 will likely be different than the noise coupled to a data line (e.g., 405). While capacitors 418 and 419 may reduce high frequency noise on node 417, variations in power supply voltage P2 406 are not tightly coupled to node 417. The variations in power supply voltages P1 403 and P2 406 are coupled to the data inputs (e.g., 430) differently than variations are coupled to node 417. Likewise, power supply noise is coupled to the data inputs differently and thus noise and power supply variations may not manifest themselves as common mode signals that may be reduced by the common mode rejection capabilities of the differential receivers (e.g., 410, 413, and 416).

Figure 5:
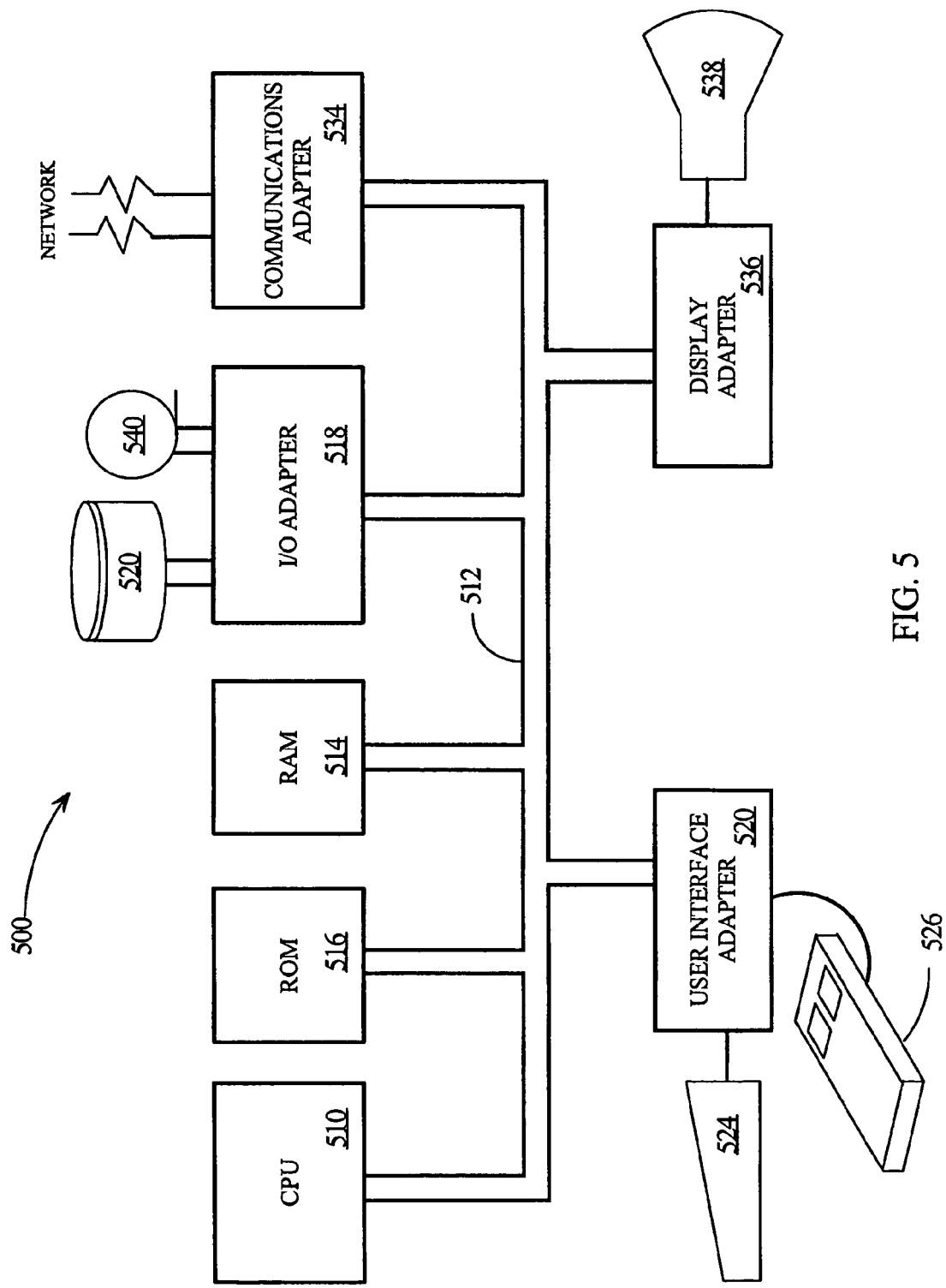
FIG. 5 is a block diagram of a data processing system, with a system devices that incorporate integrated circuits for communicating between functional units, that is suitable for practicing embodiments of the present invention.

FIG. 5 is a high level functional block diagram of a representative data processing system 500 suitable for practicing principles of the present invention. Data processing system 500 includes a central processing system (CPU) 510 operating in conjunction with a system bus 512. System bus 512 operates in accordance with a standard bus protocol, such as the ISA protocol, compatible with CPU 510. CPU 510 operates in conjunction with electronically erasable programmable read-only memory (EEPROM) 516 and random access memory (RAM) 514. Among other things, EEPROM 516 supports storage of the Basic Input Output System (BIOS) data and recovery code. RAM 514 includes, DRAM (Dynamic Random Access Memory) system memory and SRAM (Static Random Access Memory) external cache. I/O Adapter 518 allows for an interconnection between the devices on system bus 512 and external peripherals, such as mass storage devices (e.g., a hard drive, floppy drive or CD/ROM drive), or a printer 540. A peripheral device 520 is, for example, coupled to a peripheral control interface (PCI) bus, and I/O adapter 518, therefore, may be a PCI bus bridge. User interface adapter 522 couples various user input devices, such as a keyboard 524 or mouse 526 to the processing devices on bus 512. Display 538 which may be, for example, a cathode ray tube (CRT), liquid crystal display (LCD) or similar conventional display units. Display adapter 536 may include, among other things, a conventional display controller and frame buffer memory. Data processing system 500 may be selectively coupled to a computer or telecommunications network 541 through communications adapter 534. Communications adapter 534 may include, for example, a modem for connection to a telecom network and/or hardware and software for connecting to a computer network such as a local area network (LAN) or a wide area network (WAN). CPU 510 and other components of data processing system 500 may contain logic circuitry in two or more integrated circuit (IC) chips (not shown) that are separated by a significant distance relative to their communication frequency such that a line driver according to embodiments of the present invention, may be used to set an optimal driver impedance for each particular transmission path between the IC chips.

Although the present invention and its advantages have been described in detail, it should be understood that various changes, substitutions and alterations can be made herein without departing from the spirit and scope of the invention as defined by the appended claims.

What is claimed is:

1. A circuit for driving a data signal on a transmission line comprising:
    a number of J driver stages each having an output coupled to a common node forming a driver output node and a P input and an N input forming a number of 2J inputs, wherein the J driver stages couple the common node to a first power supply potential through a first group of K resistors in response to a first logic state of the P input and couples the common node to a second power supply potential with a second group of K resistors in response to a second logic state of the N input; and
    a control logic circuit for setting the logic states on the 2J inputs of the J driver stages in response to a one or more of a present logic state of the data signal, a previous state of the data signal, and mode control signals to vary a source resistance of the driver output node, wherein the mode control signals are set by generating a test data signal as the data signal and varying the first and second resistance values and determining an optimal first resistance value and an optimal second resistance value to optimize a signal quality characteristic of the data signal propagated on the transmission line.

2. The circuit of claim 1, wherein the control logic circuit sets the logic states of the 2J inputs so the source resistance of the driver output node has a first resistance value if the present logic state of the data signal is the same as a successive previous logic state of the data signal, and a second resistance value if the present logic state of the data signal is different from the successive previous logic state of the data signal.

3. The circuit of claim 1, wherein the mode input signals determine a ratio of the first resistance value to the second resistance value.

4. The circuit of claim 3, wherein the first resistance value is determined by a parallel combination of a variable number K resistors in the first group of J resistors or in the second group of J resistors, and the second resistance value is determined by a parallel combination of a variable number Q of resistors in the first group of J resistors or in the second group of J resistors.

5. The circuit of claim 1, wherein each of the driver stages comprises:
    a P-channel field effect transistor (PFET) having a gate terminal coupled as the P input, a source terminal coupled to the first power supply potential and a drain terminal;
    a first resistor having a first node coupled to the common node and a second node coupled to the drain terminal of the PFET;
    a N-channel field effect transistor (NFET) having a gate terminal coupled as the N input, a source terminal coupled to the second power supply potential and a drain terminal; and
    a first resistor having a first node coupled to the common node and a second node coupled to the drain terminal of the NFET.

6. The circuit of claim 1, wherein the states of the mode control signals are stored after being set in response to the test signal and used to control the line driver source resistances during propagation of the data signal on the transmission line.

7. The circuit of claim 1, wherein the signal quality characteristic comprises minimizing transition times between logic states of the data signal.

8. A data processing system comprising:
    a central processing unit (CPU);
    a random access memory (RAM);
    a read only memory (ROM); and
    a bus system coupling the CPU to the ROM and the RAM, wherein the data processing system contains two or more integrated circuits that communicate using a circuit for driving a data signal on a transmission line, the circuit having a number of J driver stages each having an output coupled to a common node forming a driver output node and a P input and an N input forming a number of 2J inputs, wherein the J driver stages couple the common node to a first power supply potential through a first group of K resistors in response to a first logic state of the P input and couples the common node to a second power supply potential with a second group of K resistors in response to a second logic state of the N input, and a control logic circuit for setting the logic states on the 2J inputs of the J driver stages in response to a one or more of a present logic state of the data signal, a previous state of the data signal, and mode control signals to vary a source resistance of the driver output node, wherein the mode control signals are set by generating a test data signal as the data signal and varying the first and second resistance values and determining an optimal first resistance value and an optimal second resistance value to optimize a signal quality characteristic of the data signal propagated on the transmission line.

9. The data processing system of claim 8, wherein the control logic circuit sets the logic states of the 2J inputs so the source resistance of the driver output node has a first resistance value if the present logic state of the data signal is the same as a successive previous logic state of the data signal, and a second resistance value if the present logic state of the data signal is different from the successive previous logic state of the data signal.

10. The data processing system of claim 8, wherein the mode input signals determine a ratio of the first resistance value to the second resistance value.

11. The data processing system of claim 10, wherein the first resistance value is determined by a parallel combination of a variable number K resistors in the first group of J resistors or in the second group of J resistors, and the second resistance value is determined by a parallel combination of a variable number Q of resistors in the first group of J resistors or in the second group of J resistors.

12. The data processing system of claim 8, wherein each of the driver stages comprises:
    a P-channel field effect transistor (PFET) having a gate terminal coupled as the P input, a source terminal coupled to the first power supply potential and a drain terminal;

a first resistor having a first node coupled to the common node and a second node coupled to the drain terminal of the PFET;

a N-channel field effect transistor (NFET) having a gate terminal coupled as the N input, a source terminal coupled to the second power supply potential and a drain terminal; and a first resistor having a first node coupled to the common node and a second node coupled to the drain terminal of the NFET.

13. The data processing system of claim 8, wherein the states of the mode control signals are stored after being set in response to the test signal and used to control the line driver source resistances during propagation of the data signal on the transmission line.

14. The data processing system of claim 8, wherein the signal quality characteristic comprises minimizing transition times between logic states of the data signal.

* * * * *